United States Patent
Khatun et al.

(10) Patent No.: US 11,842,130 B1
(45) Date of Patent: Dec. 12, 2023

(54) MODEL-BASED SIMULATION RESULT PREDICTOR FOR CIRCUIT DESIGN

(71) Applicant: Cadence Design Systems, Inc., San Jose, CA (US)

(72) Inventors: Saleha Khatun, San Jose, CA (US); David Varghese, San Ramon, CA (US); Roland Ruehl, San Carlos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 235 days.

(21) Appl. No.: 17/503,001

(22) Filed: Oct. 15, 2021

(51) Int. Cl.
*G06F 30/27* (2020.01)
*G06F 30/367* (2020.01)

(52) U.S. Cl.
CPC .......... *G06F 30/27* (2020.01); *G06F 30/367* (2020.01)

(58) Field of Classification Search
CPC .............................. G06F 30/27; G06F 30/367
See application file for complete search history.

(56) References Cited

U.S. PATENT DOCUMENTS

| | | | |
|---|---|---|---|
| 11,475,194 B1* | 10/2022 | Yeung | G06F 30/27 |
| 2021/0182466 A1* | 6/2021 | Le | G06N 3/08 |
| 2022/0253206 A1* | 8/2022 | Bergsrud | G06T 11/206 |

FOREIGN PATENT DOCUMENTS

CN 113011626 A * 6/2021

OTHER PUBLICATIONS

Ma et al. DEVoT: Dynamic Delay Modeling of Functional units Under Voltage and Temperature Variations IEEE, Apr. 30, 2021 (Year: 2021).*
Ma et al. DEVoT: Dynamic Delay Modeling of Functional units Under Voltage and Temperature Variations (Date Proof) EEE, Apr. 30, 2021 (Year: 2021).*

* cited by examiner

*Primary Examiner* — Rehana Perveen
*Assistant Examiner* — Cuong V Luu
(74) *Attorney, Agent, or Firm* — Schwegman Lundberg & Woessner, P.A.

(57) ABSTRACT

Various embodiments provide for predicting a simulation result for a circuit design using a machine learning model, which can be used as part of a process of an electronic design automation (EDA) system that measures a circuit design (e.g., timing, power, voltage, current, etc.). In particular, various embodiments described herein can enable modeling simulated time measurements of a circuit design, and can enable such modeling with minimal usage of simulation result data.

20 Claims, 6 Drawing Sheets

MODEL-BASED SIMULATION RESULT PREDICTOR FOR CIRCUIT DESIGN

TECHNICAL FIELD

Embodiments described herein relate to circuit design and, more particularly, to systems, methods, devices, and instructions for predicting a simulation result for a circuit design using a model, which can be used as part of electronic design automation (EDA) system.

BACKGROUND

Semiconductor fabrication and manufacturing technologies allow integrated circuits to be implemented on a die and across a wafer. Identical circuits on a wafer or within the same die can have different performance characteristics due to wafer fabrication or manufacturing process variations, which may be caused by known physical phenomena during manufacturing.

BRIEF DESCRIPTION OF THE SEVERAL VIEWS OF THE DRAWINGS

Various ones of the appended drawings merely illustrate various embodiments of the present disclosure and should not be considered as limiting its scope.

DETAILED DESCRIPTION

Figure 1:
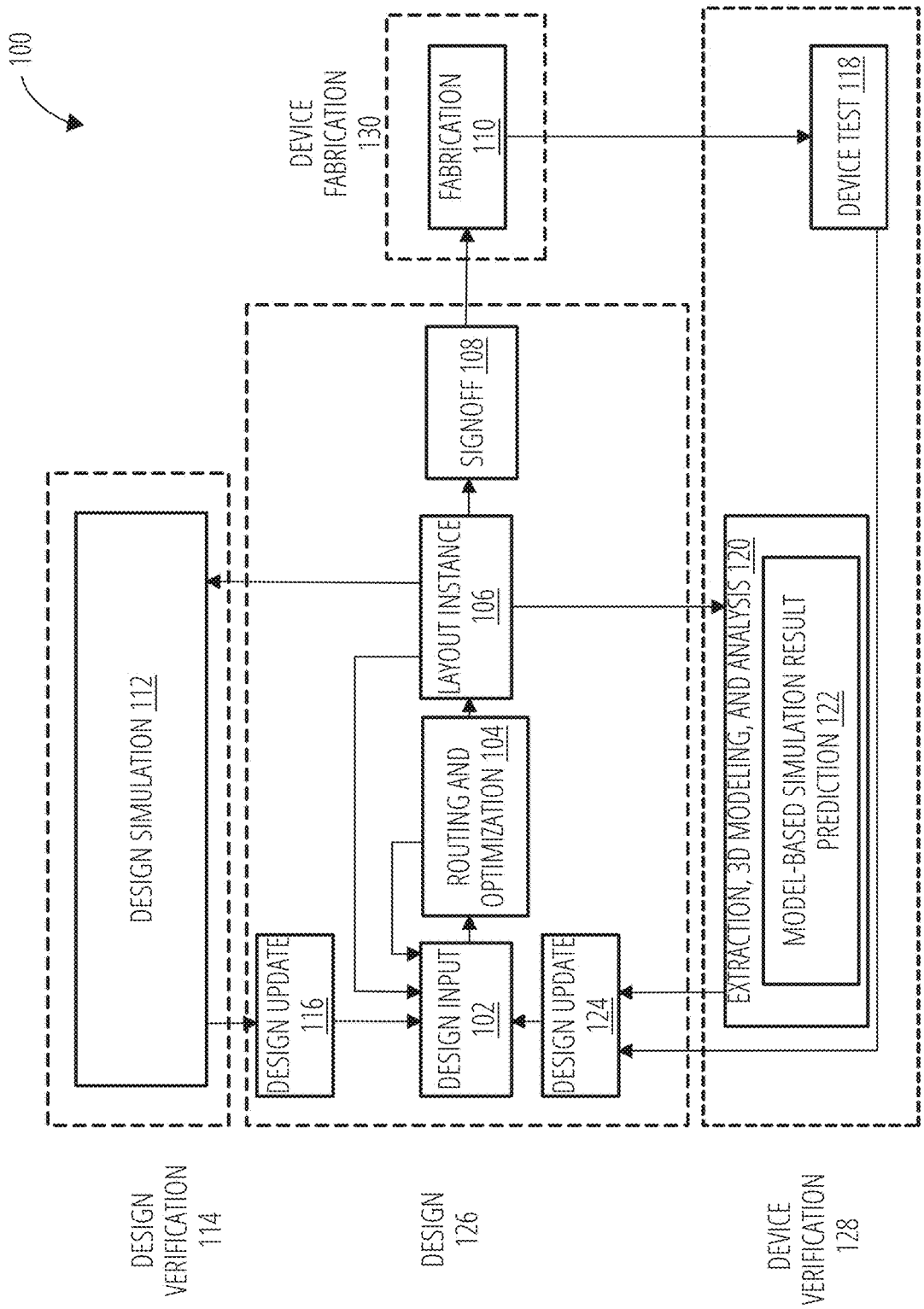
FIG. 1 is a diagram illustrating an example design process flow for predicting a simulation result for a circuit design using a model, according to some embodiments.

To make a circuit design robust under unpredictability of fabrication/manufacturing process variations, the circuit design can be simulated at multiple design conditions (e.g., various process, voltage, and temperature (PVT) conditions, or design-specific variables) that are chosen to encapsulate the behavior of a circuit design under the best-case or worst-case process fabrication/manufacturing process variations. Such conditions for best-case or worst-case process variations are sometimes referred to as corner conditions, process corners, or just corners. These corner conditions can comprise one or more process, voltage, temperature conditions, design-specific variables, or some combination thereof. Generally, a process corner-based methodology is used to simulate a circuit design at a number of corner conditions. At times, the number of corner conditions can become large enough that simulating a circuit design can become computationally long or inefficient.

Simulation of a circuit design is usually based on a cell library (e.g., for a particular process technology, such as a device dimension of 4 nm) provided by a wafer fabricator or manufacturer, where the cell library includes process-specific timing information for different cells (e.g., devices) described in the cell library, and where the process-specific timing information covers multiple corner conditions (e.g., worst-case corner conditions and best-case corner conditions). In particular, process-specific timing information can be implemented as one or more process corner models (or corner models), which form a process corner library associated with the cell library. For instance, a fabricator or manufacturer can place different types of devices (e.g., transistors) on a wafer using a particular process technology (e.g., 4 nm), test the behavior of the different types of devices (e.g., as voltage or transistor dimension is varied) on the wafer, and characterize the behavior of different types of devices to generate corner models for those different types of devices. Eventually, a timing analysis tool (such as a static timing analysis (STA) tool of an EDA system) can use one or more of process corner models (from the process corner library) to simulate a circuit design that includes one or more cells from the cell library and, can use the simulation results to determine effects of one or more the fabrication or manufacturing process variations on the performance of the circuit design. Specifically, each process corner model can simulate a circuit design at a number of corner conditions, and the results (from the corner model) can be used to characterize the impact of one or more process variations on the performance of a circuit design.

Aggressive scaling of semiconductor nodes (e.g., device dimensions now approaching 2 nm), combined with lower device operating voltages and currents, has allowed modern ICs and System-On-Chip (SoC) designs to integrate more devices, in a smaller chip area, without compromising on lower power consumption and optimal performance. At the same time, this aggressive process scaling, combined with large volume manufacturing, is making it difficult to ensure that ICs (such as static random access memory (SRAM) ICs, dynamic random access memory (DRAM) ICs, flash-memory ICs, and other memory ICs) have a low probability of failure after fabrication. Simulation (e.g., by a STA) of an IC over corner conditions is used to ensure that the IC has a low probability of failure.

For example, memory ICs are usually simulated over various critical corner conditions, which are verified for failure before the memory ICs are fabricated. Simulating and verifying functionality of a memory IC that uses 14 nm technology can, for instance, involve approximately 200 PVT corner conditions. In another instance, simulating and verifying functionality of a circuit design implementing an SRAM IC (e.g., generated by an SRAM compiler) can involve simulating over a number of corner conditions that results in tens of thousands (e.g., 60,000) simulations being performed. Additionally, the overall compute time for performing a full transient simulation of a circuit design (implementing a memory block) that covers various measurements (e.g., read, write, setup, and hold time) can take weeks or months for completion. This does not even include the statistical variation-based simulation (e.g., Monte-Carlo analysis), which is also usually performed to ensure a high-yield of memory ICs (e.g., yield close to 6 sigma—finding one failure in a billion).

Various embodiments provide for predicting a simulation result for a circuit design using a machine learning model, which can be used as part of a process of an electronic design automation (EDA) system that measures a circuit design (e.g., timing, power, voltage, current, etc.). In particular, various embodiments described herein can enable modeling simulated measurements (e.g., time measurements) of a circuit design, and can enable such modeling with minimal usage of simulation result data. As used herein, a measurement for a circuit design can include, without limitation, a time measurement, a power (consumption) measurement, a voltage (usage) measurement, a current (usage) measurement, and the like. For instance, some embodiments can model simulated measurements for a circuit design based on simulation result data that describe actual simulation results (e.g., actual simulated measurements) generated by actually simulating the circuit design a number (e.g., minimal number) of times over a set (e.g., first set) of condition values (e.g., process variation values, voltage variation values, temperature variation values, capacitance load values, etc.). For various embodiments described herein, the modeling comprises generating a machine learning model for a circuit design, where the machine learning model is generated (e.g., trained) based on simulation result data that describe results from simulating a circuit design a number of times over different combination of condition values (e.g., variation values) of the circuit designs. Once generated based on actual simulation results, a model (e.g., machine learning model) can be used to generate predicted simulation results (e.g., actual simulated measurements) for a circuit design over a set (e.g., second set) of condition values (e.g., process variation values, voltage variation values, temperature variation values, etc.), which can be used in place of actually simulating the circuit design for the set (e.g., second set) of condition values. In this way, the model can be used to save time and computational resources when analyzing a circuit design.

The model (e.g., machine learning model) generated by various embodiments can be accurate, fast, and facilitate automatic estimation of critical functionality measurements (e.g., time measurements) performed on a circuit design (e.g., a memory circuit over a varying array of sizes and corner conditions). For example, with respect to a circuit design comprising a SRAM memory block, some embodiments can generate and use a machine learning model to predict simulation results and combine predicted simulation results with actual simulation results during analysis (e.g., characterization) of the SRAM memory block, where the conditions analyzed can include PVT variations, capacitive load, SRAM array size, and the like. Accordingly, where a traditional methodology for analyzing the SRAM memory block would involve running 100k simulations on the SRAM memory block for 100k different combinations of condition values (e.g., values for process variations, voltage variations, temperature variations, capacitive load, SRAM array size to cover corner conditions), an embodiment described herein can significantly reduce the number of simulations performed on the SRAM memory block while achieving the same number of simulation results. For example, an embodiment can generate 50k actual simulation results by performing 50k simulations on the SRAM memory block for 50k of the 100k different combinations of condition values, generate a model (e.g., machine learning model) based on the 50k actual simulation results, and use the generated model to generate (e.g., predict) 50k predicted simulation results for the remaining 50k of the 100k different combinations of condition values, which is intended to obviate the need to perform the simulation on the SRAM memory block for those remaining 50k different combinations of condition values. In this way, the overall characterization run-time for the SRAM memory block would be much faster and use less computing resources, which can also result in lower monetary cost (e.g., lower hardware or cloud computing costs).

For some embodiments, the simulation results provided (e.g., displayed) to the customer can comprise predicted simulation results combined with actual simulation results and, accordingly, some embodiments can tag or label the provided simulation results to distinguish between actual and predicted simulation results. Additionally, some embodiments provide for a user interface (e.g., graphical user interface) that can enable a user to interact with the simulation results, and can enable a user to facilitate generation of a model (e.g., machine learning model) based on actual simulation results. For instance, an embodiment can generate a correlation map based on one or more actual simulation results (e.g., actual simulated measurements) for a circuit design, where the correlation map describes one or more correlations between a condition and a simulated measurement for the circuit design. The embodiment can cause the correlation map to be displayed to a user (e.g., on a client device). Based on the correlation map, the user can select or deselect use of a condition as a feature (e.g., input feature) of a machine learning model to be generated based on (e.g., trained using) the actual simulation results, where the machine learning model is to generate a predicted simulation result (e.g., predicted simulated measurement) for the circuit design. For instance, the correlation map can indicate that only a subset of all the conditions (e.g., all PVT variations) used in simulating the circuit design had a strong correlation (e.g., impact) on the actual simulated measurement. Based on such a correlation map, the user can select to use the subset of conditions to train the machine learning model. The embodiment can then generate (e.g., train) the machine learning model using, from the actual simulation results, data that describes actual simulated measurement values and associated subset of condition values.

As used herein, a simulation result can comprise a simulated measurement value (e.g., simulated time, power, voltage, or current measurement) for a circuit design (e.g., simulated time measurement value for a setup clock time or hold clock time for RAM memory block), and a set of condition values (e.g., process variation value, voltage variation value, temperature variation value, capacitive load value, number of words value, bit size value, etc.) corresponding to different conditions/condition categories (e.g., process variation, voltage variation, temperature variation, capacitive load, number of words, bit size, etc.) under which the circuit design is being simulated, where the set of conditions values were used by the simulator to generate (e.g., output) the simulated measurement value. As used herein, an actual simulation result for a circuit design can refer to a simulation result that is generated by simulating the circuit design (e.g., based on one or more conditions). The actual simulation result can also be referred to herein as a non-predicted simulation result. As used herein, a predicted simulation result for a circuit design can refer to a simulation result that is generated (e.g., predicted) by a model (e.g., trained machine learning model based on a feature vector) and that does not involve simulating the circuit design.

As used herein, simulating a circuit design under a given condition/condition category can comprise simulating the circuit design under a range of condition values, or a set of possible/predetermined condition values, for that given condition/condition category. For example, a set of possible/predetermined condition values for process variation can include slow slow (SS), slow fast (SF), fast slow (FS), fast fast (FF), typical typical (TT), and the like, with each value representing a different statistical speed of a transistor (e.g., as determined by a particular fabricator or manufacturer). A set of possible/predetermined condition values for voltage variation can include a list of values in volts (e.g., 0.5, 0.55, 0.6, 0.65, 0.7, 0.8, 0.95, 1.115, etc.). A set of possible/predetermined condition values for temperature variation can include a list of values in degrees Celsius or Fahrenheit (e.g., −40, −30, −25, −10, 0, 15, 25, 125, etc.). A set of possible/predetermined condition values for a number of words can include a list of values in bits (e.g., 128, 256, 2048, 4096, etc.) and a set of possible/predetermined condition values for bit size can also include a list of values in bits (e.g., 42, 72, 78, 108, etc.).

As used herein, a feature of a machine learning model can represent a condition (such as a process variation, a voltage variation, a temperature variation, a capacitance load, a number of words, a bit size, or an array size of a circuit design), and a value (or feature value) for the feature can comprise a value for the condition. Additionally, as used herein, a feature vector can comprise one or more feature values, where each feature value in the vector corresponds to a different feature. Each feature vector can represent a different combination of possible feature values (e.g., condition values) for features (e.g., conditions) of interest for a circuit design. In this way, each feature vector can represent a different combination of condition values for conditions of interest for a circuit design. An individual feature vector can represent an individual configuration of a circuit design, and an output generated by a machine learning model in response to the individual feature vector can comprise a predicted simulation result for the individual feature vector.

Though various embodiments are described herein with respect to a model comprising a machine learning model, it will be appreciated that some embodiments can be implemented to use other types of models. For instance, a model used by an embodiments can range from a model that a user provides to a model that is fully machine generated. Additionally, as used herein, a machine learning model can comprise a model implementing any one of a variety of machine learning approaches, such as a random forest model, a Bayesian model, or a Linear model. For various models described herein, different models can be used for (e.g., better suited for use on) different types of circuit designs. For instance, a random forest model can be used on a circuit design comprising an SRAM memory block, while another type of model (e.g., Bayesian model) can be used for a non-SRAM circuit design.

Though various embodiments are described herein with respect to time measurements, it will be understood that embodiments described herein can be applied to different types of measurements for a circuit design, such as voltage measurements, power measurements, current measurements, and the like.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for predicting a simulation result for a circuit design using a model, according to some embodiments. As shown, the design process flow 100 includes a design phase 126, a device fabrication phase 130, a design verification phase 114, and a device verification phase 128. The design phase 126 involves an initial design input 102 operation where the basic elements and functionality of a device are determined, as well as revisions based on various analyses and optimization of a circuit design. This design input 102 operation is where block instances are used in the circuit design and any additional circuitry for the design around the blocks is selected. The initial strategy, tactics, and context for the device to be created are also generated in the design input 102 operation, depending on the particular design algorithm to be used.

In some embodiments, following an initial selection of design values in the design input 102 operation, routing, timing analysis, and optimization are performed in a routing and optimization 104 operation, along with any other automated design processes. Though not shown, the routing and optimization 104 operation can include a clock tree synthesis (CTS) operation, which can generate one or more clock trees that deliver clock signal from clock sources of a circuit design to a plurality of clock tree leaf nodes comprising clock tree pins (e.g., of circuit devices, such as flip-flops) within the circuit design. The routing and optimization 104 operation may also include other operations not shown, such as those relating to floorplanning, placement, post-placement optimization, and post-routing optimization.

While the design process flow 100 shows optimization occurring prior to a layout instance 106, timing analysis, and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 108, as described below.

Design inputs are used in the design input 102 operation to generate an initial circuit layout. The design inputs may be further processed during the design input 102 operation via a process, such as logic-synthesis to generate a circuit netlist mapped to a target standard library manufacturable by the foundry in fabrication 110 operation. After design inputs are used in the design input 102 operation to generate an initial circuit layout, and any of the routing and optimization 104 operations are performed, a resulting layout is generated as the layout instance 106. The netlist as placed by the layout instance 106 describes the physical layout dimensions of the device that match the design inputs. Prior to this layout being provided to a fabrication 110 operation, the signoff 108 is performed on the circuit design defined by the layout.

After signoff verification by the signoff 108, a verified version of the layout is used in the fabrication 110 operation to generate a device, or additional testing and design updates may be performed using designer inputs or automated updates based on design simulation 112 operations or extraction, 3D modeling, and analysis 120 operations. Once the device is generated, the device can be tested as part of device test 118 operations, and layout modifications generated based on actual device performance.

As described in more detail below, a design update 116 from the design simulation 112; a design update 124 from the device test 118 or the extraction, 3D modeling, and analysis 120 operations; or the design input 102 operation may occur after the initial layout instance 106 is generated. In various embodiments, whenever design inputs are used to update or change an aspect of a circuit design, a timing analysis and the routing and optimization 104 operation may be performed.

As shown, the extraction, 3D modeling, and analysis 120 operation includes a model-based simulation result prediction 122 operation for predicting a simulation result for a circuit design using a model (e.g., machine learning model), which can be performed in accordance with various embodiments described herein. For some embodiments, model-based simulation result prediction 122 operation can be performed as part of an analysis process (e.g., a time analysis process, such as a static time analysis (STA) process) performed on a circuit design, which can be used (e.g., by an EDA system) to ensure a circuit design has a low probability of failure after fabrication 110.

Figure 2:
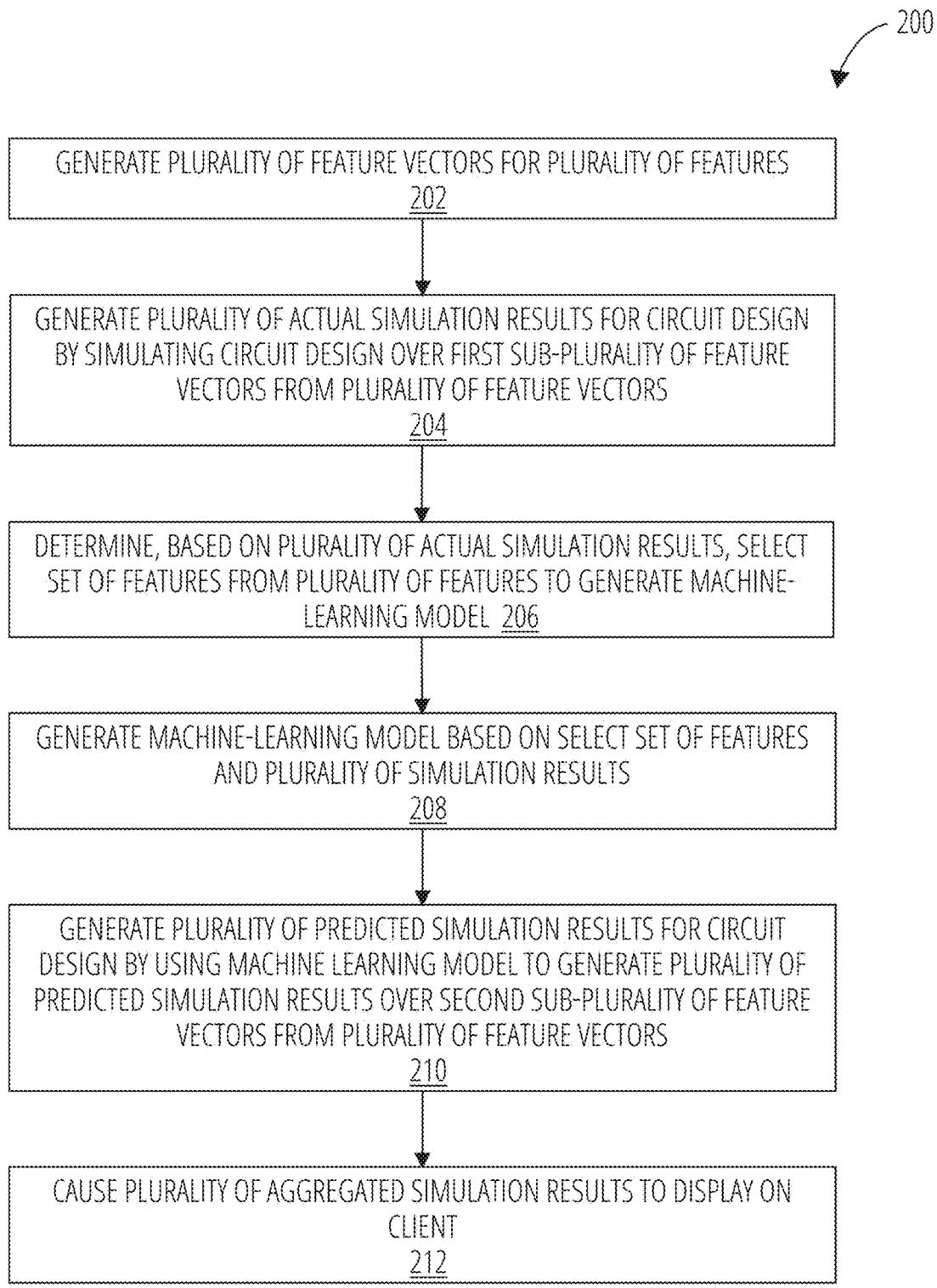
FIG. 2 illustrates an example method for predicting a simulation result for a circuit design using a machine learning model, according to some embodiments.

FIG. 2 is a flowchart illustrating an example method for predicting a simulation result for a circuit design using a machine learning model, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Depending on the embodiment, the method 200 can be performed as part of an analysis process (e.g., a time analysis process, such an STA process) performed on a circuit design. For instance, the method 200 can be used to analyze a circuit design over multiple corner conditions (e.g., PVT corners).

Referring now to FIG. 2, operation 202 generates a plurality of feature vectors for a plurality of features (e.g., features F1, F2, F3, F4), where at least one feature (e.g., F1, F2, F3, or F4) in the plurality of features relates to a variation of a circuit design. For some embodiments, the variation can comprise a process variation, a voltage variation, or a temperature variation. For instance, an individual feature vector can comprise a first value (e.g., selected from SS, SF, FS, FF, TT) corresponding to a process variation, a second value (e.g., selected from 0.5, 0.55, 0.6, 0.65, 0.7, 0.8, 0.95, or 1.115 volts) corresponding to a voltage variation, and a third value (e.g., selected from −40, −30, −25, −10, 0, 15, 25, 125 degrees Celsius) corresponding to a temperature variation. For some embodiments, the plurality of feature vectors are generated (e.g., configured) with feature values that facilitate analysis of the circuit design over multiple corner conditions.

According to some embodiments, the circuit design represents a memory block (e.g., SRAM array). Accordingly, at least another feature in the plurality of features can relate to a number of words of the memory block, a number of bits of the memory block, or a memory array size of the memory block. Additionally, where the circuit design represents a memory block, the circuit design can be generated by a memory circuit (e.g., SRAM) design compiler. The plurality of feature vectors can be configured to cover optimal corner conditions across M×N memory configurations of the memory block coming from a circuit design compiler.

Subsequently, operation 204 generates a plurality of actual simulation results (e.g., non-predicted simulation results) for a circuit design by simulating the circuit design over a first sub-plurality of feature vectors from the plurality of feature vectors (generated by operation 202). For some embodiments, each feature vector in the plurality of feature vectors is unique within the plurality. In this way, each feature vector in the plurality of feature vectors represents a unique combination of condition values for the circuit design. Additionally, for some embodiments, the plurality of actual simulation results comprises an individual actual simulation result comprising a simulated measurement (e.g., simulated time measurement) generated for the circuit design based on an individual feature vector from the first sub-plurality of feature vectors. Operation 204 can use a simulator, such as Simulation Program with Integrated Circuit Emphasis (SPICE) tool, to simulate the circuit design over a first sub-plurality of feature vectors to generate the plurality of actual simulation results (e.g., simulate the circuit design based on condition values provided by each individual feature vector in the first sub-plurality of feature vectors). For some embodiments, the number of actual simulation results in the plurality of actual simulation results satisfies a minimum training size determined for the machine learning model. The minimum training size can represent a minimum sample size of actual simulation results needed to generate (e.g., sufficiently train) the machine learning model that can predict simulation results with a desired accuracy (e.g., in view of the predetermined error tolerance). The minimum training size can be determined based on a predetermined error tolerance. For instance, it can be determined that in order for a machine learning model (eventually generated by operation 210) to achieve an error rate that is lower than the predetermined error tolerance, the machine learning model will need to train a certain minimum amount of actual simulation results. Depending on the embodiment, the predetermined tolerance (e.g., 3 picoseconds) can be defined by a user (e.g., circuit engineer). Additionally, depending on the embodiment, the minimum training size based on the predetermined error tolerance can be determined (e.g., by a user) based on testing (e.g., comparing error between actual simulation results and predicted simulation results during testing).

Based on the plurality of simulation results, operation 206 determines a select set of features, from the plurality of features, to generate a machine learning model for generating one or more predicted measurements (e.g., predicted time measurements) for the circuit design. For some embodiments, operation 206 comprises generating, based on the plurality of actual simulation results from operation 204, a correlation map between one or more measurements for the circuit design and the plurality of features, and selecting the select set of features, from the plurality of features, based on the generated correlation map. According to various embodiments, the correlation map comprises one or more correlation values, where each correlation value describes a correlation (e.g., a level of correlation) between an individual measurement (e.g., individual time measurement, such as delay, read, write, setup, and hold time) for the circuit design and an individual feature (e.g., one relating to a process variation, a voltage variation, or a temperature variation) from the plurality of features. Depending on the embodiment, selection of the select set of features can involve user input or user interaction based on the generated correlation map. For example, the select set of features can be selected from the plurality of features by: causing at least a portion of the correlation map to display on a user interface (e.g., graphical user interface on a client device); and receiving through the user interface a user input that identifies at least one feature (e.g., all the features) in the select set of features. For instance, a user can select those features (from the plurality of features) that have a certain amount of correlation (e.g., have a strong correlation with the simulated measurement of interest) as described by the generated correlation map. Additionally, or alternatively, where the correlation map comprises a correlation value that describes a correlation between an individual measurement for the circuit design and an individual feature from the plurality of features, selecting the select set of features (from the plurality of features) based on the correlation map can comprise: determining whether the correlation value transgresses (e.g., is higher than) a correlation value threshold; and selecting the individual feature as part of the select set of features in response to the correlation value transgressing the correlation value threshold. In this way, some embodiments can automatically select one or more features, from the plurality of features, to be part of the select set of features based on correlation values and the correlation value threshold.

Eventually, operation 208 generates the machine learning model based on the select set of features (determined by operation 206) and the plurality of simulation results (generated by operation 204). For some embodiments, the machine learning model comprises a random forest model. Alternatively, the machine learning model can comprise Bayesian machine learning model or a linear machine learning model. As described herein, each actual simulation result can comprise a simulated measurement (e.g., a simulated time measurement for clock hold time) generated for the circuit design based on an individual feature vector (e.g., <x1, x2, x3, x4> for features F1, F2, F3, F4). For some embodiments, generating the machine learning model based on an individual actual simulation result can comprise training the machine learning model using the simulated measurement (provided by the individual actual simulation result) as the expected output, and the individual feature vector (provided by the individual actual simulation result and causing generation of the simulated measurement) as the input that resulted in the expected output. Additionally, where the select set of features (e.g., F1 and F3) is less than all the features (e.g., F1, F2, F3, F4) that have a corresponding value within the individual feature vector, only those values in the individual feature vector (e.g., only values x1 and x3 from a feature vector <x1, x2, x3, x4> for features F1, F2, F3, F4) corresponding to the select set of features (e.g., F1 and F3) are used as the inputs that resulted in the expected output. By using the selected set of features (e.g., that have the strongest correlation to the simulated measurement), training time of the machine learning model can be reduced, and the complexity (e.g., size) and/or speed of the machine learning model can be reduced.

The following generically describes how an example machine learning model can be identified for use by various embodiments described herein. Assuming that a behavior of a circuit design (e.g., circuit design that is a design under test (DUT)) is described by a function Y (where Y is a function of input variables X1, X2 . . . Xn to the circuit design), a computational model M can be determined to model the output Y as a function of the input variables. The variables of function Y can be used as features of the model M such that: Y1=Predicted M[F(X1, X2 . . . Xn )], and Y2=Simulated S[F(X1, . . . Xn)], where Model Error=Y2− Y1. Based on this type of circuit behavior, there can be several possible machine learning models (e.g., M1, M2, . . . Mr, are r is numbers of possible machine learning models tried) of different types/categories (ensemble, gaussian process, ridge regression, deep neural regression, etc.) that can be used with the circuit design. After deriving the correlation matrix between Y and the identified features/variables X1 to Xn for each of the possible machine learning models tried, the model error of each of the different machine learning models is determined. Using the determined model errors of the different machine learning models, at least one of machine learning models is identified as correctly (e.g., best) fitting the behavior of the circuit design. In particular, if E is an error function which calculates error of an individual machine learning model, and if M1, M2, . . . Mr are r numbers of machine learning models from different categories, then the at least one machine learning model is identified by solving following equation where R is the index of the machine learning model generating the lowest error, as follows:

$$R = \mathrm{argmin}^{-r}\ (i=1\ \mathrm{to}\ r)[\ (E(M1), E(M2), \ldots E(Mr)).$$

Using the machine learning model generated by operation 208, operation 210 generates a plurality of predicted results over a second sub-plurality of feature vectors from the plurality of feature vectors. For various embodiments, the second sub-plurality of feature vectors is different from (e.g., mutually exclusive) from the first sub-plurality of feature vectors used to generate the plurality of actual simulation results at operation 204. The plurality of predicted results from operation 210 and the plurality of actual simulation results from operation 204 can be aggregated (e.g., combined) together to generate a plurality of aggregated simulation results. The plurality of aggregated simulation results can represent a final simulation result for the circuit design.

Thereafter, operation 212 causes a plurality of aggregated simulation results to display on a user interface (e.g., graphical user interface on a client device), where the plurality of aggregated simulation results comprises the plurality of actual simulation results and the plurality of predicted simulation results. For some embodiments, the plurality of aggregated simulation results as displayed (on the user interface) includes a tag or label that indicates whether a simulation result (of the plurality of aggregated simulation results) corresponds to an actual simulation result (from the plurality of actual simulation results provided by operation 204) or a predicted simulation result (from the plurality of predicted simulation results provided by operation 210).

Figure 3:
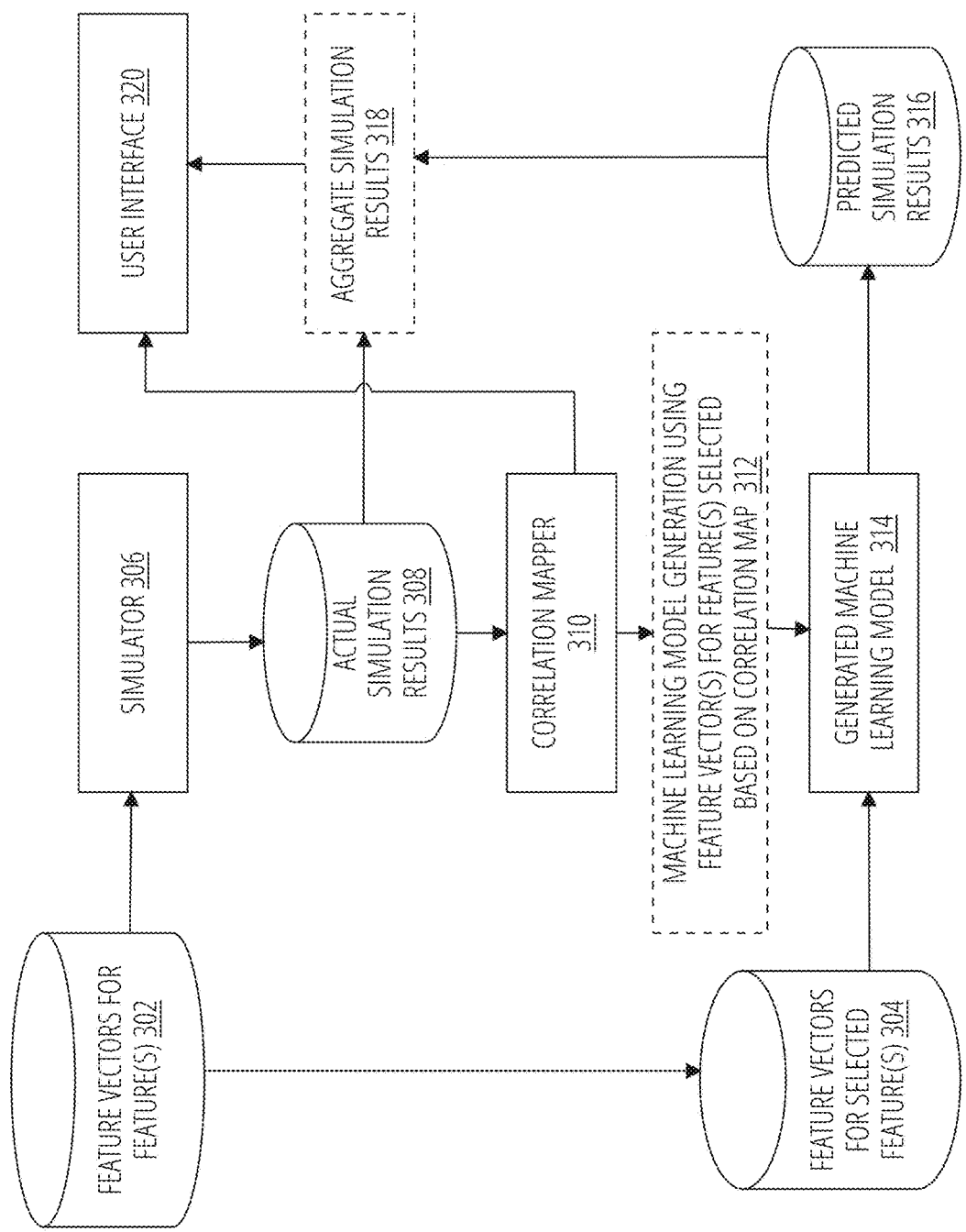
FIG. 3 is a diagram illustrating an example data flow for an aspect of the subject matter in accordance with one embodiment.

FIG. 3 is a diagram illustrating an example data flow 300 for an aspect of the subject matter in accordance with one embodiment. According to some embodiments, the data flow 300 corresponds to at least some of the operations performed by the method 200 described above with respect to FIG. 2. In FIG. 3, a first portion of feature vectors 302 for one or more features are received and used by a simulator 306 to generate actual simulation results 308. Based on the actual simulation results 308, a correlation mapper 310 generates a correlation map, which can be displayed (at least in part) on a user interface 320 (e.g., for purposes of a user selecting or deselecting one or more features that will be used to generate a machine learning model). A machine learning model is generated (at 312) (e.g., trained) using one or more feature vectors, from the actual simulation results 308, for one or more features selected based on the correlation map (generated by the correlation mapper 310). Eventually, a second portion of the feature vectors 302 (e.g., the portion of feature vectors not used by the simulator 306 to generate the actual simulation results 308) are obtained and, from this second portion, feature vectors 304 for the one or more selected features are used by the generated machine learning model 314 to generate predicted simulation results 316. Thereafter, the actual simulation results 308 and the predicted simulation results 316 are aggregated (at 318), and the aggregated simulation results can be displayed on the user interface 320.

Figure 4:
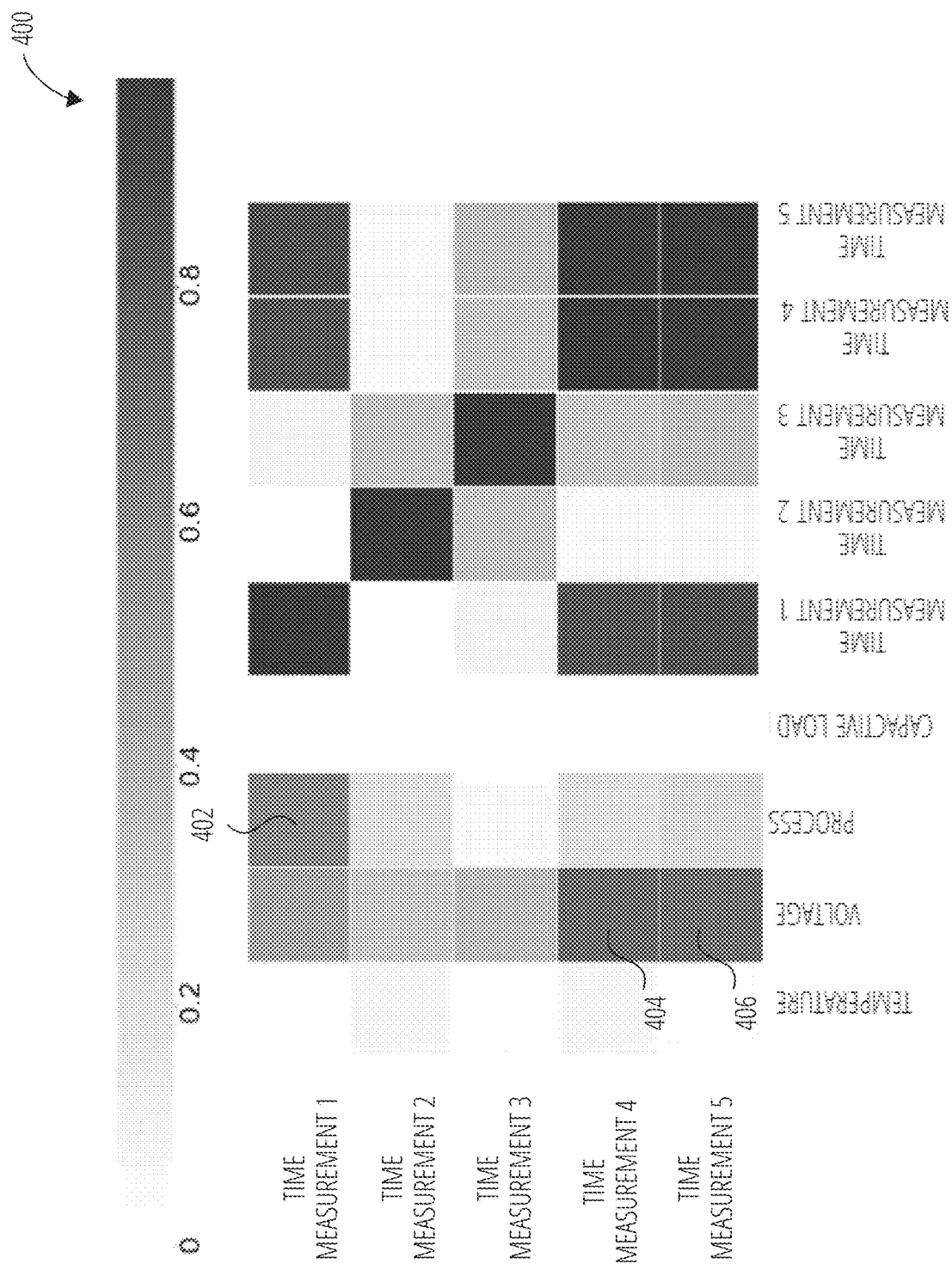
FIG. 4 illustrates a visual representation of an example correlation map generated for selecting features for a machine learning model, according to some embodiments.

FIG. 4 illustrates a visual representation of an example correlation map 400 generated for selecting features for a machine learning model, according to some embodiments. As shown, the visual representation comprises a heatmap, where correlation values range from 0 to 1. According to various embodiments, the correlation map 400 is generated based on actual simulation results generated by simulating a circuit design over a plurality of feature vectors. In the heatmap, the simulated time measurements comprise TIME MEASUREMENT 1, TIME MEASUREMENT 2, TIME MEASUREMENT 3, TIME MEASUREMENT 4, and TIME MEASUREMENT 5 for a circuit design. One or more of these time measurements can represent, for example, a delay time, a read time, a write time, a setup time, and a hold time associated with the circuit design. As illustrated by the heatmap, a feature associated with temperature variation has little or low correlation with respect to all of the time measurements. Accordingly, some embodiments would not use this feature associated with temperature variation to train a machine learning model (as described herein) used to predict TIME MEASUREMENTS 1, 2, 3, 4, or 5. Like the feature associated with temperature variation, a feature associated with capacitive load has little or no correlation respect to all of the time measurements and, thus, would not be used to train a machine learning model (as described herein) used to predict TIME MEASUREMENTS 1, 2, 3, 4, or 5.

As shown by the heatmap, a feature associated with process variation has low to medium correlation with TIME MEASUREMENTS 2 through 5, and medium to strong correlation with TIME MEASUREMENT 1 (as illustrated at 402). Accordingly, some embodiments would not use this feature associated with process variation to train a machine learning model (as described herein) used to predict TIME MEASUREMENTS 2, 3, 4, or 5, but can use this feature associated with process variation to train a machine learning model (as described herein) used to predict TIME MEASUREMENT 1. As also shown, a feature associated with voltage variation has medium to high correlation with TIME MEASUREMENTS 1 through 5, with particularly strong correlation with respect to TIME MEASUREMENTS 4 and 5 (as illustrated at 404, 406 respectively).

Accordingly, some embodiments would use this feature associated with voltage variation to train a machine learning model (as described herein) used to predict TIME MEASUREMENTS 1, 2, 3, 4, or 5.

Figure 5:
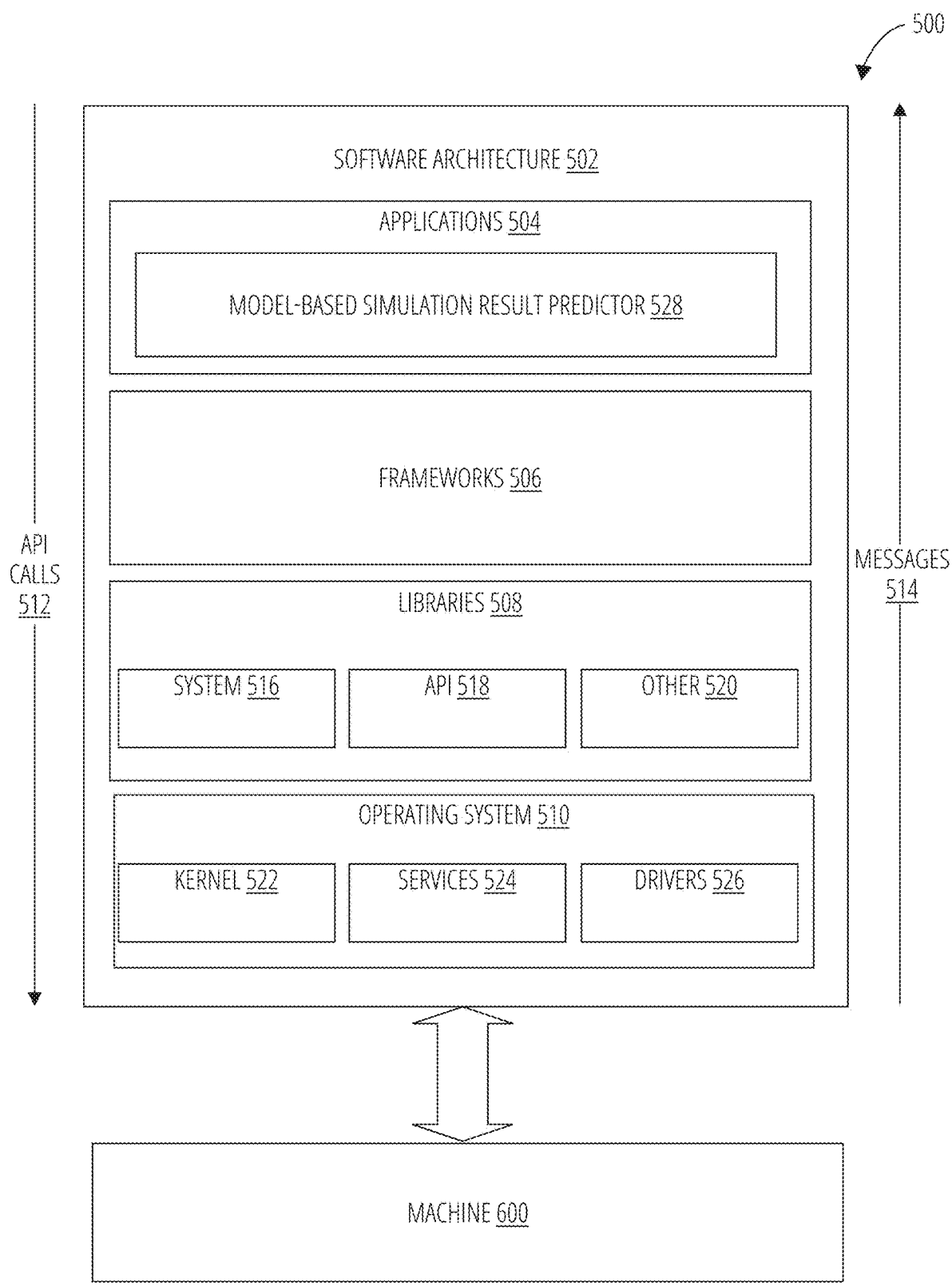
FIG. 5 is a block diagram illustrating an example of a software architecture that may be operating on an electronic design automation (EDA) computing device and may be used with methods for predicting a simulation result for a circuit design using a model, according to some embodiments.

FIG. 5 is a block diagram 500 illustrating an example of a software architecture 502 that may be operating on an EDA computer and may be used with methods for predicting a simulation result for a circuit design using a model, according to some embodiments. The software architecture 502 can be used as an EDA computing device to implement any of the methods described above. Aspects of the software architecture 502 may, in various embodiments, be used to store circuit designs, and to facilitate generation of a circuit design in an EDA environment, from which physical devices may be generated.

FIG. 5 is merely a non-limiting example of a software architecture 502, and it will be appreciated that many other architectures can be implemented to facilitate the functionality described herein. In various embodiments, the software architecture 502 is implemented by hardware such as a machine 600 of FIG. 6 that includes processors 604, memory 612, and I/O components 622. In this example, the software architecture 502 can be conceptualized as a stack of layers where each layer may provide a particular functionality. For example, the software architecture 502 includes layers such as an operating system 510, libraries 508, frameworks 506, and applications 504. Operationally, the applications 504 invoke application programming interface (API) calls 512 through the software stack and receive messages 514 in response to the API calls 512, consistent with some embodiments. In various embodiments, any client device, any server computer of a server system, or any other device described herein may operate using elements of the software architecture 502. An EDA computing device described herein may additionally be implemented using aspects of the software architecture 502, with the software architecture 502 adapted for operating to perform a simulation result prediction for a circuit design in a manner described herein.

In some embodiments, an EDA application of the applications 504 performs a simulation result prediction (for a circuit design) using a model according to embodiments described herein using various modules within the software architecture 502. For example, in some embodiments, an EDA computing device similar to the machine 600 includes the memory 612 and the one or more processors 604. The processors 604 also implement a model-based simulation result predictor 528 for predicting a simulation result for a circuit design using a model, in accordance with various embodiments described herein.

In various other embodiments, rather than being implemented as modules of the one or more applications 504, the model-based simulation result predictor 528 may be implemented using elements of the libraries 508, the operating system 510, or the software frameworks 506.

In various implementations, the operating system 510 manages hardware resources and provides common services. The operating system 510 includes, for example, a kernel 522, services 524, and drivers 526. The kernel 522 acts as an abstraction layer between the hardware and the other software layers, consistent with some embodiments. For example, the kernel 522 provides memory management, processor management (e.g., scheduling), component management, networking, and security settings, among other functionality. The services 524 can provide other common services for the other software layers. The drivers 526 are responsible for controlling or interfacing with the underlying hardware, according to some embodiments. For instance, the drivers 526 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 508 provide a low-level common infrastructure utilized by the applications 504. The libraries 508 can include system libraries system 516 such as libraries of blocks for use in an EDA environment or other libraries that can provide functions such as memory allocation functions, string manipulation functions, mathematic functions, and the like. In addition, the libraries 508 can include API libraries 518 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D)

in a graphic context on a display), database libraries (e.g., SQLite to provide various relational database functions), web libraries (e.g., WebKit to provide web browsing functionality), and the like. The libraries 508 may also include other libraries 520.

The software frameworks 506 provide a high-level common infrastructure that can be utilized by the applications 504, according to some embodiments. For example, the software frameworks 506 provide various graphic user interface (GUI) functions, high-level resource management, high-level location services, and so forth. The software frameworks 506 can provide a broad spectrum of other APIs that can be utilized by the applications 504 some of which may be specific to a particular operating system 510 or platform. In various embodiments, the systems, methods, devices, and instructions described herein may use various files, macros, libraries, and other elements of an EDA design environment to implement a simulation result predictions (for a circuit design) using a model as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 502, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machine 600 including processors 604), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 600, but deployed across a number of machines 600. In some embodiments, the processors 604 or processor-implemented modules are located in a single geographic location (e.g., within a home environment, an office environment, or a server farm). In some other embodiments, the processors or processor-implemented modules are distributed across a number of geographic locations.

Figure 6:
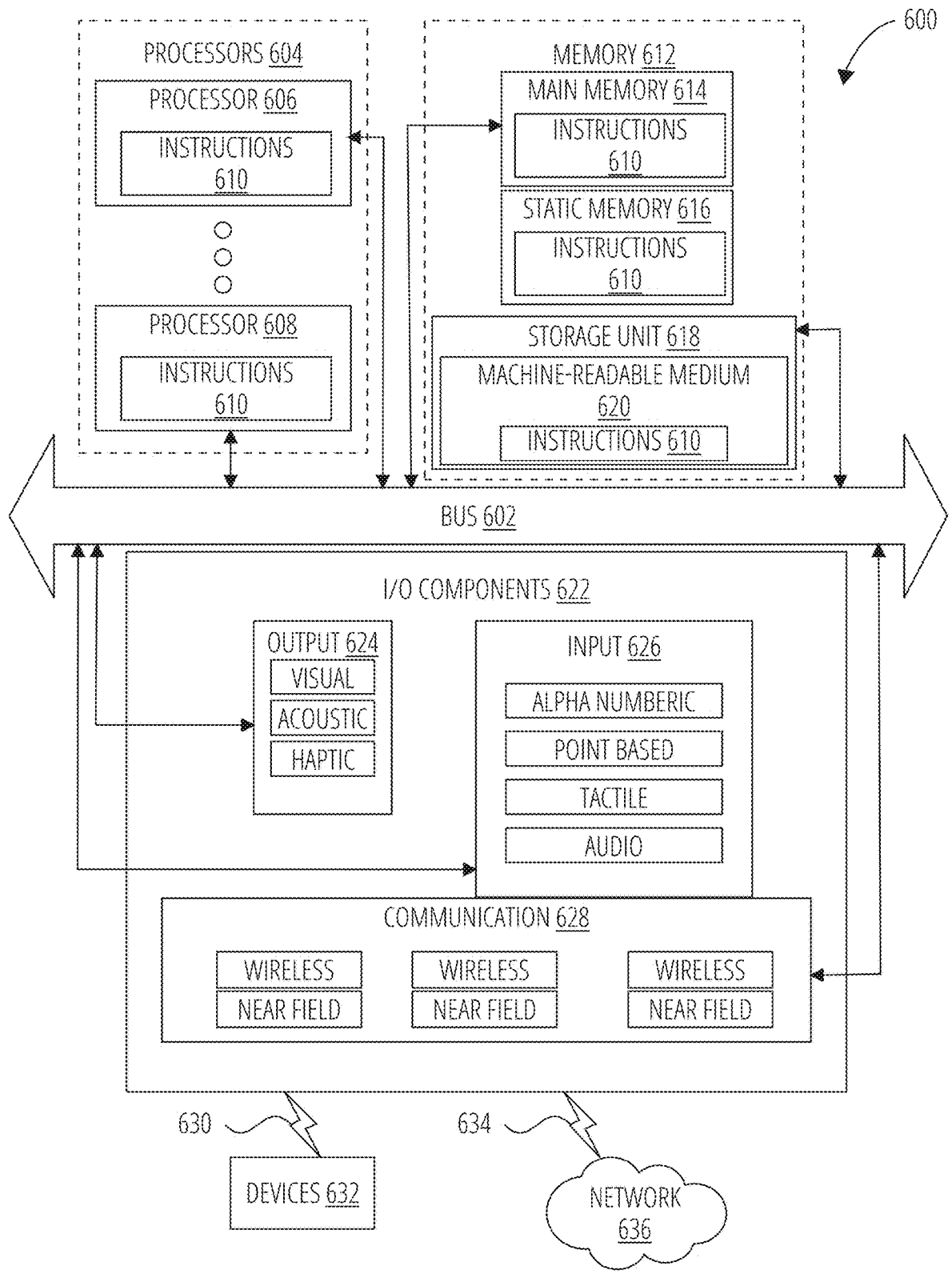
FIG. 6 is a diagram representing a machine in the form of a computer system within which a set of instructions are executed, causing the machine to perform any one or more of the methods discussed herein, according to some embodiments.

FIG. 6 is a diagrammatic representation of the machine 600 in the form of a computer system within which a set of instructions may be executed for causing the machine 600 to perform any one or more of the methodologies discussed herein, according to some embodiments. FIG. 6 shows components of the machine 600, which is, according to some embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a computer system, within which instructions 610 (e.g., software, a program, an application, an applet, an app, or other executable code) for causing the machine 600 to perform any one or more of the methodologies discussed herein can be executed. In alternative embodiments, the machine 600 operates as a standalone device or can be coupled (e.g., networked) to other machines. In a networked deployment, the machine 600 may operate in the capacity of a server machine or a client machine in a server-client network environment, or as a peer machine in a peer-to-peer (or distributed) network environment. The machine 600 can comprise, but not be limited to, a server computer, a client computer, a personal computer (PC), a tablet computer, a laptop computer, a netbook, or any machine capable of executing the instructions 610, sequentially or otherwise, that specify actions to be taken by the machine 600. Further, while only a single machine 600 is illustrated, the term "machine" shall also be taken to include a collection of machines 600 that individually or jointly execute the instructions 610 to perform any one or more of the methodologies discussed herein.

In various embodiments, the machine 600 comprises processors 604, memory 612, and I/O components 622, which can be configured to communicate with each other via a bus 602. In some embodiments, the processors 604 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 606 and a processor 608 that may execute the instructions 610. The term "processor" is intended to include multi-core processors 604 that may comprise two or more independent processor 606, 608 (also referred to as "cores") that can execute the instructions 610 contemporaneously. Although FIG. 6 shows multiple processors 604, the machine 600 may include a single processor 606 with a single core, a single processor 606 with multiple cores (e.g., a multi-core processor 606), multiple processors 604 with a single core, multiple processors 604 with multiple cores, or any combination thereof.

The memory 612 comprises a main memory 614, a static memory 616, and a storage unit 618 accessible to the processors 604 via the bus 602, according to some embodiments. The storage unit 618 can include a machine-readable medium 620 on which are stored the instructions 610 embodying any one or more of the methodologies or functions described herein. The instructions 610 can also reside, completely or at least partially, within the main memory 614, within the static memory 616, within at least one of the processors 604 (e.g., within the processor's cache memory), or any suitable combination thereof, during execution thereof by the machine 600. Accordingly, in various embodiments, the main memory 614, the static memory 616, and the processors 604 are considered machine-readable media 620.

As used herein, the term "memory" refers to a machine-readable medium 620 able to store data temporarily or permanently and may be taken to include, but not be limited to, random-access memory (RAM), read-only memory (ROM), buffer memory, flash memory, and cache memory. While the machine-readable medium 620 is shown, in some embodiments, to be a single medium, the term "machine-readable medium" should be taken to include a single medium or multiple media (e.g., a centralized or distributed database, or associated caches and servers) able to store the instructions 610. The term "machine-readable medium" shall also be taken to include any medium, or combination of multiple media, that is capable of storing instructions (e.g., the instructions 610) for execution by a machine (e.g., the machine 600), such that the instructions, when executed by one or more processors of the machine (e.g., the processors 604), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 622 include a wide variety of components to receive input, provide output, produce output, transmit information, exchange information, capture measurements, and so on. In general, it will be appreciated that the I/O components 622 can include many other components that are not shown in FIG. 6. The I/O components 622 are grouped according to functionality merely for simplifying the following discussion, and the grouping is in no way limiting. In various embodiments, the I/O components 622 include output components 624 and input components 626. The output components 624 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 626 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 622 may include communication components 628 operable to couple the machine 600 to a network 636 or devices 632 via a coupling 634 and a coupling 630, respectively. For example, the communication components 628 include a network interface component or another suitable device to interface with the network 636. In further examples, the communication components 628 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 632 may be another machine or any of a wide variety of peripheral devices (e.g., a peripheral device coupled via a USB).

In various embodiments, one or more portions of the network 636 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 636 or a portion of the network 636 may include a wireless or cellular network, and the coupling 634 may be a Code Division Multiple Access (CDMA) connection, a Global System for Mobile communications (GSM) connection, or another type of cellular or wireless coupling.

Furthermore, the machine-readable medium 620 is non-transitory (in other words, not having any transitory signals) in that it does not embody a propagating signal. However, labeling the machine-readable medium 620 "non-transitory" should not be construed to mean that the machine-readable medium 620 is incapable of movement; the machine-readable medium 620 should be considered as being transportable from one physical location to another. Additionally, since the machine-readable medium 620 is tangible, the machine-readable medium 620 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:
   generating a plurality of feature vectors for a plurality of features, a first feature in the plurality of features relating to at least one of a process variation, a voltage variation, or a temperature variation, and a second feature in the plurality of features relating to at least one of a number of words of a memory block, a number of bits of the memory block, or a memory array size of the memory block;
   generating a plurality of actual simulation results for a circuit design that represents the memory block, the generating of the plurality of actual simulation results comprising simulating the circuit design over a first sub-plurality of feature vectors from the plurality of feature vectors, the plurality of actual simulation results comprising an individual actual simulation result that comprises a simulated measurement for the circuit design based on an individual feature vector from the first sub-plurality of feature vectors;

based on the plurality of actual simulation results, determining a select set of features from the plurality of features to generate a machine learning model for generating one or more predicted measurements for the circuit design;

generating the machine learning model based on the select set of features and the plurality of actual simulation results; and generating a plurality of predicted simulation results for the circuit design by using the machine learning model to generate the plurality of predicted simulation results over a second sub-plurality of feature vectors from the plurality of feature vectors.

2. The non-transitory computer-readable medium of claim 1, wherein the operations comprise:

causing a plurality of aggregated simulation results to display on a user interface, the plurality of aggregated simulation results comprising the plurality of actual simulation results and the plurality of predicted simulation results.

3. The non-transitory computer-readable medium of claim 2, wherein the plurality of aggregated simulation results as displayed includes a label that indicates whether a simulation result of the plurality of aggregated simulation results corresponds to an actual simulation result or a predicted simulation result.

4. The non-transitory computer-readable medium of claim 1, wherein the determining of the select set of features from the plurality of features based on the plurality of actual simulation results comprises:

generating, based on the plurality of actual simulation results, a correlation map between one or more measurements for the circuit design and the plurality of features; and selecting the select set of features, from the plurality of features, based on the correlation map.

5. The non-transitory computer-readable medium of claim 4, wherein the selecting of the select set of features, from the plurality of features, based on the correlation map comprises:

causing at least a portion of the correlation map to display on a user interface; and receiving user input that identifies at least one feature in the select set of features.

6. The non-transitory computer-readable medium of claim 4, wherein the correlation map comprises a correlation value that describes a correlation between an individual measurement for the circuit design and an individual feature from the plurality of features, and wherein the selecting of the select set of features, from the plurality of features, based on the correlation map comprises:

determining whether the correlation value transgresses a correlation value threshold; and selecting the individual feature as part of the select set of features in response to the correlation value transgressing the correlation value threshold.

7. The non-transitory computer-readable medium of claim 1, wherein a number of actual simulation results in the plurality of actual simulation results satisfies a minimum training size determined for the machine learning model.

8. The non-transitory computer-readable medium of claim 7, wherein the minimum training size is determined based on a predetermined error tolerance.

9. The non-transitory computer-readable medium of claim 1, wherein the machine learning model comprises a random forest model.

10. The non-transitory computer-readable medium of claim 1, wherein the circuit design is simulated over a first sub-plurality of feature vectors using a Simulation Program with Integrated Circuit Emphasis (SPICE) tool.

11. The non-transitory computer-readable medium of claim 1, wherein the circuit design is generated by a memory circuit design compiler.

12. A device comprising:

a memory storing instructions; and a hardware processor communicatively coupled to the memory and configured by the instructions to perform operations comprising:

generating a plurality of feature vectors for a plurality of features, a first feature in the plurality of features relating to a variation of a circuit design, and a second feature in the plurality of features relating to at least one of a number of words of a memory block, a number of bits of the memory block, or a memory array size of the memory block;

generating a plurality of actual simulation results for the circuit design that represents the memory block, the generating of the plurality of actual simulation results comprising simulating the circuit design over a first sub-plurality of feature vectors from the plurality of feature vectors, the plurality of actual simulation results comprising an individual actual simulation result that comprises a simulated measurement for the circuit design based on an individual feature vector from the first sub-plurality of feature vectors;

based on the plurality of actual simulation results, determining a select set of features from the plurality of features to generate a machine learning model for generating one or more predicted measurements for the circuit design;

generating the machine learning model based on the select set of features and the plurality of actual simulation results; and generating a plurality of predicted simulation results for the circuit design by using the machine learning model to generate the plurality of predicted simulation results over a second sub-plurality of feature vectors from the plurality of feature vectors.

13. The device of claim 12, wherein the operations comprise:

causing a plurality of aggregated simulation results to display on a user interface, the plurality of aggregated simulation results comprising the plurality of actual simulation results and the plurality of predicted simulation results.

14. The device of claim 13, wherein the plurality of aggregated simulation results as displayed includes a label that indicates whether a simulation result of the plurality of aggregated simulation results corresponds to an actual simulation result or a predicted simulation result.

15. The device of claim 12, wherein the determining of the select set of features from the plurality of features based on the plurality of actual simulation results comprises:

generating, based on the plurality of actual simulation results, a correlation map between one or more measurements for the circuit design and the plurality of features; and selecting the select set of features, from the plurality of features, based on the correlation map.

16. The device of claim 15, wherein the selecting of the select set of features, from the plurality of features, based on the correlation map comprises:
  causing at least a portion of the correlation map to display on a user interface; and
  receiving user input that identifies at least one feature in the select set of features.

17. The device of claim 15, wherein the correlation map comprises a correlation value that describes a correlation between an individual measurement for the circuit design and an individual feature from the plurality of features, and wherein the selecting of the select set of features, from the plurality of features, based on the correlation map comprises:
  determining whether the correlation value transgresses a correlation value threshold; and
  selecting the individual feature as part of the select set of features in response to the correlation value transgressing the correlation value threshold.

18. The device of claim 12, wherein a number of actual simulation results in the plurality of actual simulation results satisfies a minimum training size determined for the machine learning model.

19. A method comprising:
  accessing, by a hardware processor, a plurality of feature vectors for a plurality of features, a first feature in the plurality of features relating to a variation of a circuit design, and a second feature in the plurality of features relating to at least one of a number of words of a memory block, a number of bits of the memory block, or a memory array size of the memory block;
  generating, by the hardware processor, a plurality of actual simulation results for the circuit design that represents the memory block, the generating of the plurality of actual simulation results comprising simulating the circuit design over a first sub-plurality of feature vectors from the plurality of feature vectors, the plurality of actual simulation results comprising an individual actual simulation result that comprises a simulated measurement for the circuit design based on an individual feature vector from the first sub-plurality of feature vectors;
  based on the plurality of actual simulation results, determining, by the hardware processor, a select set of features from the plurality of features to generate a model for generating one or more predicted measurements for the circuit design;
  generating, by the hardware processor, the model based on the select set of features and the plurality of actual simulation results; and
  generating, by the hardware processor, a plurality of predicted simulation results for the circuit design by using the model to generate the plurality of predicted simulation results over a second sub-plurality of feature vectors from the plurality of feature vectors.

20. The device of claim 12, wherein the circuit design is generated by a memory circuit design compiler.

* * * * *